United States Patent
Tianhao et al.

(10) Patent No.: US 10,964,585 B2
(45) Date of Patent: Mar. 30, 2021

(54) METHOD FOR FORMING A FIN-BASED SEMICONDUCTOR STRUCTURE

(71) Applicants: Semiconductor Manufacturing International (Beijing) Corporation, Beijing (CN); Semiconductor Manufacturing International (Shanghai) Corporation, Shanghai (CN)

(72) Inventors: Zhang Tianhao, Shanghai (CN); Wu Yichao, Shanghai (CN)

(73) Assignees: Semiconductor Manufacturing (Beijing) International Corporation, Beijing (CN); Semiconductor Manufacturing (Shanghai) International Corporation, Shanghai (CN)

( * ) Notice: Subject to any disclaimer, the term of this patent is extended or adjusted under 35 U.S.C. 154(b) by 7 days.

(21) Appl. No.: 16/537,123

(22) Filed: Aug. 9, 2019

(65) Prior Publication Data

US 2020/0211894 A1 Jul. 2, 2020

(30) Foreign Application Priority Data

Dec. 26, 2018 (CN) .......................... 201811605458.4

(51) Int. Cl.
*H01L 21/76* (2006.01)
*H01L 21/762* (2006.01)
(Continued)

(52) U.S. Cl.
CPC .... *H01L 21/76224* (2013.01); *H01L 21/0206* (2013.01); *H01L 21/308* (2013.01);
(Continued)

(58) Field of Classification Search
CPC ......... H01L 21/76224; H01L 29/66795; H01L 21/31111; H01L 29/7851; H01L 21/31144;
(Continued)

(56) References Cited

U.S. PATENT DOCUMENTS

9,263,340 B2 * 2/2016 Taylor, Jr. ........ H01L 21/823431
9,704,973 B2 * 7/2017 Xie .................... H01L 29/66795
(Continued)

*Primary Examiner* — Shouxiang Hu
(74) *Attorney, Agent, or Firm* — Brinks Gilson & Lione (57) ABSTRACT

Disclosed are a semiconductor structure and a method for forming same. One form of the forming method includes: providing a base, including a substrate and a fin protruding out of the substrate, where a fin mask layer is formed on the top of the fin, and the base includes a graphics-intensive region and a graphics-sparse region; forming an isolation material layer on the substrate exposed by the fin, to expose a top of the fin mask layer; performing first etching processing on the isolation material layer, where a residual isolation material layer covers a partial sidewall of the fin mask layer, and a top of the residual isolation material layer located on the graphics-sparse region is lower than a top of the residual isolation material layer located on the graphics-intensive region; removing the fin mask layer after the first etching processing is performed; and performing second etching processing on the residual isolation material layer using an isotropic dry etching process after the fin mask layer is removed, where the etched isolation material layer is used as an isolation layer, and the isolation layer covers a partial sidewall of the fin. Embodiments of the present disclosure help to improve the height consistency of the tops of isolation layers located on different graphics density regions, thereby improving the performance of the semiconductor structure.

15 Claims, 5 Drawing Sheets

(51) Int. Cl.

| | |
|---|---|
| *H01L 29/66* | (2006.01) |
| *H01L 21/311* | (2006.01) |
| *H01L 29/78* | (2006.01) |
| *H01L 21/02* | (2006.01) |
| *H01L 29/06* | (2006.01) |
| *H01L 21/306* | (2006.01) |
| *H01L 21/308* | (2006.01) |
| *H01L 21/3065* | (2006.01) |
| *H01L 21/8238* | (2006.01) |

(52) U.S. Cl.
CPC ...... *H01L 21/3065* (2013.01); *H01L 21/3083* (2013.01); *H01L 21/30604* (2013.01); *H01L 21/31111* (2013.01); *H01L 21/31116* (2013.01); *H01L 21/31144* (2013.01); *H01L 21/823821* (2013.01); *H01L 29/0653* (2013.01); *H01L 29/66795* (2013.01); *H01L 29/7851* (2013.01)

(58) Field of Classification Search
CPC ............. H01L 21/0206; H01L 29/0653; H01L 21/31116; H01L 21/823431; H01L 21/823481; H01L 27/0886; H01L 29/785; H01L 21/823821; H01L 21/30604; H01L 21/3065; H01L 21/308; H01L 21/3083
See application file for complete search history.

(56) References Cited

U.S. PATENT DOCUMENTS 9,831,098 B2* 11/2017 Dou ................ H01L 21/823431
10,276,720 B2* 4/2019 Chen ............... H01L 21/823431
2016/0329248 A1* 11/2016 Liou .................... H01L 29/0688

* cited by examiner

METHOD FOR FORMING A FIN-BASED SEMICONDUCTOR STRUCTURE

RELATED APPLICATIONS

The present application claims priority to Chinese Patent Appln. No. 201811605458.4, filed Dec. 26, 2018, the entire disclosure of which is hereby incorporated by reference.

BACKGROUND

Technical Field

Embodiments and implementations of the present disclosure relate to the field of semiconductor manufacturing, and in particular, to a semiconductor structure and a method for forming same.

Related Art

During semiconductor manufacturing, with the development tendency of ultra-large-scale integrated circuits, a characteristic dimension of an integrated circuit is continuously reduced. To adapt to the smaller characteristic dimension, the channel length of a metal-oxide-semiconductor field-effect transistor (MOSFET) is also continuously reduced correspondingly. However, with the reduction of the channel length of the device, the distance between a source and a drain of the device is shortened correspondingly. Therefore, the control capability of a gate structure for the channel becomes worse correspondingly, and it is increasingly difficult for a gate voltage to pinch off the channel. Consequently, a subthreshold leakage phenomenon, that is, a so-called short-channel effect (SCE) occurs more easily.

Therefore, to better adapt to the reduction of the characteristic dimension, the semiconductor process gradually begins the transition from a planar MOSFET to a three-dimensional transistor having higher efficacy, such as a fin field effect transistor (FinFET). In the FinFET, a gate structure may at least control an ultra thin body (fin) from two sides. Compared with the planar MOSFET, the gate structure has a stronger control capability for the channel, and can well suppress the SCE; and compared with other devices, the FinFET can be better compatible with the existing integrated circuit manufacturing.

SUMMARY

The problem to be address in embodiments and implementations of the present disclosure is to provide a semiconductor structure and a method for forming same, to improve the height consistency of the tops of isolation layers located on a graphics-intensive region and a graphics-sparse region.

To address the foregoing problem, the embodiments and implementations of the present disclosure provide a method for forming a semiconductor structure. In one form, the method includes: providing a base, where the base includes a substrate and a fin protruding out of the substrate, a fin mask layer is formed on a top of the fin, and the base includes a graphics-intensive region and a graphics-sparse region; forming an isolation material layer on the substrate exposed by the fin, where the isolation material layer exposes a top of the fin mask layer; performing first etching processing on the isolation material layer, where a residual isolation material layer covers a partial sidewall of the fin mask layer, and a top of the residual isolation material layer located on the graphics-sparse region is lower than a top of the residual isolation material layer located on the graphics-intensive region; removing the fin mask layer after the first etching processing is performed; and performing second etching processing on the residual isolation material layer using an isotropic dry etching process after the fin mask layer is removed, where the etched isolation material layer is used as an isolation layer, and the isolation layer covers a partial sidewall of the fin.

In some implementations, the first etching processing is performed using a wet etching process.

In some implementations, the method further includes: before performing the first etching processing, performing pre-etching processing on the isolation material layer using an isotropic dry etching process, where the pre-etched isolation material layer covers the partial sidewall of the fin mask layer.

In some implementations, the wet etching process is performed using an etching solution containing fluorine.

In some implementations, the wet etching process is performed using a dilute hydrofluoric acid (DHF) solution.

In some implementations, the wet etching process is performed using a DHF solution, and a volume percentage of hydrofluoric acid (HF) in the DHF solution is 50:1 to 2000:1.

In some implementations, the wet etching process is performed using a DHF solution, a temperature of the DHF solution is room temperature, and an etching time is 10 s to 120 s.

In some implementations, after the first etching processing is performed on the isolation material layer, a distance between the top of the residual isolation material layer located on the graphics-sparse region and the top of the residual isolation material layer located on the graphics-intensive region is 1 nm to 5 nm.

In some implementations, etching gas used in the second etching processing is HF gas.

In some implementations, the isotropic dry etching process used in the second etching processing is a Certas etching process.

In some implementations, etching gas used in the pre-etching processing is HF gas.

In some implementations, the isotropic dry etching process used in the pre-etching processing is a Certas etching process.

In some implementations, in the step of providing a base, a pad oxide layer is further formed between the fin mask layer and the fin; a material of the pad oxide layer is the same as a material of the isolation material layer; and after the pre-etching processing is performed, a distance between the top of the isolation material layer and a top of the pad oxide layer is 7 nm to 10 nm.

In some implementations, after the isolation layer is formed, the forming method further includes: performing deionized water cleaning processing.

In some implementations, the graphics-intensive region is a device region used to form devices, and the graphics-sparse region is an isolation region located between neighboring device regions.

The present disclosure further provides a semiconductor structure. In one form, the semiconductor structure includes: a substrate, where the substrate includes a graphics-intensive region and a graphics-sparse region; a fin, protruding out of the substrate; a fin mask layer, located on a top of the fin; and a residual isolation material layer, located on the substrate exposed by the fin, where the residual isolation material layer covers a partial sidewall of the fin mask layer, and a top of the residual isolation material layer located on the graphics-sparse region is lower than a top of the residual isolation material layer located on the graphics-intensive region.

In some implementations, a distance between the top of the residual isolation material layer located on the graphics-sparse region and the top of the residual isolation material layer located on the graphics-intensive region is 1 nm to 5 nm.

In some implementations, the semiconductor structure further includes: a pad oxide layer, located between the fin mask layer and the fin, where a material of the pad oxide layer is the same as a material of the residual isolation material layer.

In some implementations, the graphics-intensive region is a device region used to form devices, and the graphics-sparse region is an isolation region located between neighboring device regions.

Compared with the prior art, technical solutions of embodiments and implementations of the present disclosure have the following advantages:

In some implementations of the present disclosure, after the first etching processing is performed, the residual isolation material layer covers the partial sidewall of the fin mask layer. Therefore, after the fin mask layer is removed, a plurality of openings is formed in the isolation material layer, the quantity of openings located on the graphics-intensive region is greater than the quantity of openings located on the graphics-sparse region, and the area of the isolation material layer exposed by an opening sidewall of the graphics-intensive region is larger. In the step of performing second etching processing, etching gas can react with the isolation material layer exposed by the opening sidewall. On the same area region, compared with the graphics-sparse region, the surface area of the isolation material layer in contact with the etching gas is larger on the graphics-intensive region. Therefore, the etching rate of the second etching processing for the isolation material layer located on the graphics-intensive region is larger, and when the etching time is certain, the etching amount of the isolation material layer located on the graphics-intensive region is larger. In some implementations of the present disclosure, the first etching processing is performed on the isolation material layer before the second etching processing, so that the top of the residual isolation material layer located on the graphics-sparse region is lower than the top of the residual isolation material layer located on the graphics-intensive region. Therefore, through the first etching processing, the variability of the etching amounts of the isolation material layers in different graphics density regions in the step of the second etching processing can be compensated, thereby improving the height consistency of the tops of the isolation layers located on the graphics-intensive region and the graphics-sparse region, reducing the probability that the semiconductor structure has a variability problem, and optimizing the performance of the semiconductor structure.

In some implementations, before performing the first etching processing, the method further includes: performing pre-etching processing on the isolation material layer using an isotropic dry etching process. Through the pre-etching processing, the height of the top of the isolation material layer is reduced, thereby avoiding the excessively long etching time of the subsequent first etching processing, and improving the process manufacturing efficiency. Additionally, the avoiding of the excessively long etching time of the first etching processing can further correspondingly help avoid the excessively large variability of the etching amounts of the first etching processing for the isolation material layers located on the graphics-intensive region and the graphics-sparse region, so that after the first etching processing, the distance between the top of the isolation material layer located on the graphics-intensive region and the top of the isolation material layer located on the graphics-sparse region meets the process requirement, thereby further improving the effect of the first etching processing for improving the height consistency of the tops of the isolation layers located on different graphics density regions.

DETAILED DESCRIPTION

Referring to FIG. 1 to FIG. 5, FIG. 1 to FIG. 5 are schematic structural diagrams corresponding to steps in a method for forming a semiconductor structure.

Figure 1:
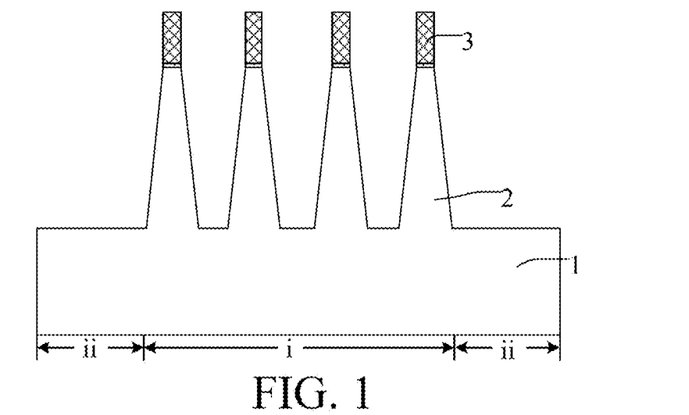
FIG. 1 to FIG. 5 are schematic structural diagrams corresponding to steps in a method for forming a semiconductor structure.

Referring to FIG. 1, a base is provided, where the base includes a substrate 1 and a fin 2 protruding out of the substrate 1, a fin mask layer 3 is formed on the top of the fin 2, and the base includes a graphics-intensive region i and a graphics-sparse region ii.

Figure 2:
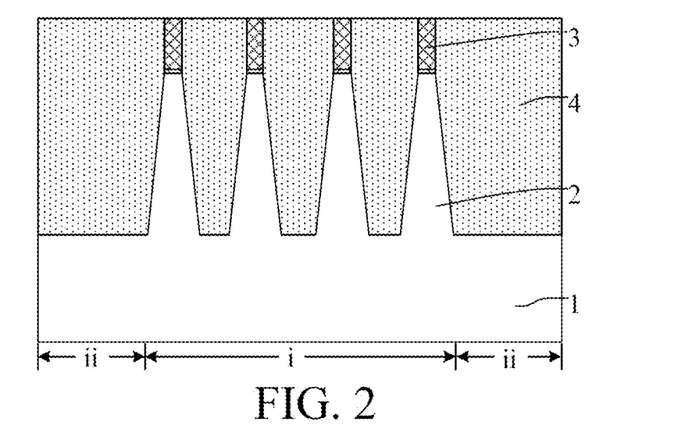

Referring to FIG. 2, an isolation material layer 4 is formed on the substrate 1 exposed by the fin 2, where the isolation material layer 4 exposes the top of the fin mask layer 3.

Figure 3:
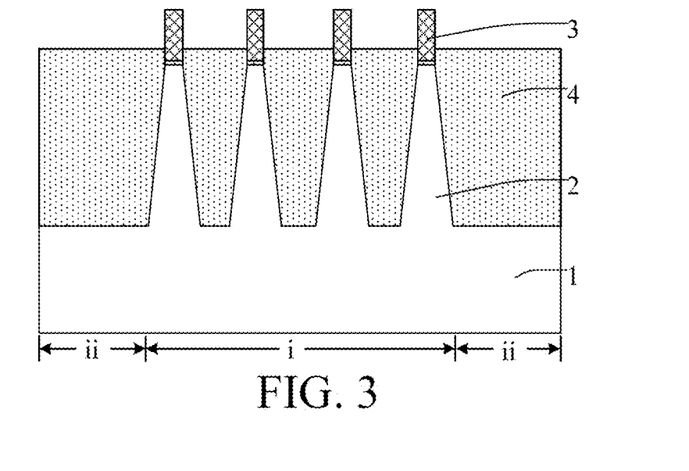

Referring to FIG. 3, pre-etching processing is performed on the isolation material layer 4 using an isotropic dry etching process, where the pre-etched isolation material layer 4 covers a partial sidewall of the fin mask layer 3.

Figure 4:
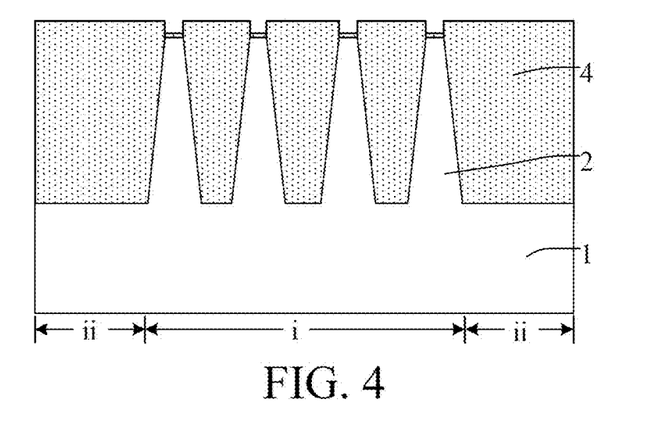

Referring to FIG. 4, the fin mask layer 3 is removed after the pre-etching processing is performed.

Figure 5:
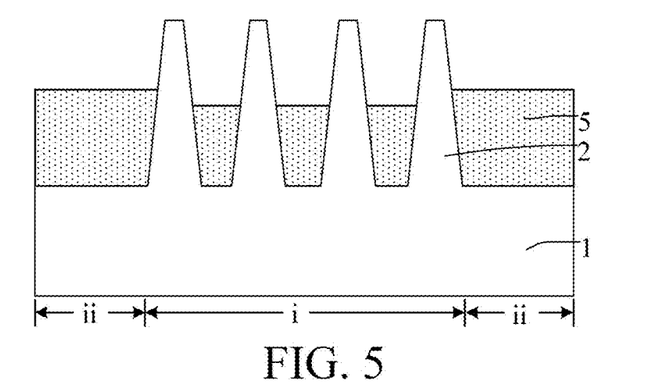

Referring to FIG. 5, second etching processing is performed on the residual isolation material layer 4 using an isotropic dry etching process after the fin mask layer 3 is removed, where the etched isolation material layer 4 is used as an isolation layer 5, and the isolation layer 5 covers a partial sidewall of the fin 2.

Because the pre-etched residual isolation material layer 4 covers the partial sidewall of the fin mask layer 3, after the fin mask layer 3 is removed, a plurality of openings (not marked) is formed in the isolation material layer 4, the quantity of openings located on the graphics-intensive region i is greater than the quantity of openings located on the graphics-sparse region ii, and the area of the isolation material layer 4 exposed by an opening sidewall on the graphics-intensive region i is larger. In the step of performing etching processing on the isolation material layer 4 using an isotropic dry etching process, etching gas can react with the isolation material layer 4 exposed by the opening sidewall. Therefore, on the same area region, compared with the graphics-sparse region, the area of the isolation material layer 4 in contact with the etching gas is larger on the graphics-intensive region i. Therefore, the etching rate of the etching processing for the isolation material layer 4 located on the graphics-intensive region i is larger, and the etching amount of the etching processing for the isolation material layer 4 located on the graphics-intensive region i is larger. Therefore, the top of the finally formed isolation layer 5 located on the graphics-intensive region i is lower than the top of the isolation layer 5 located on the graphics-sparse region ii, the height consistency of the tops of the isolation layers 5 on the graphics-intensive region i and the graphics-sparse region ii is relatively poor, the probability that the semiconductor structure has a variability problem is relatively high, and the performance of the formed semiconductor structure is poor.

To address the technical problem, the present disclosure provides a method for forming a semiconductor structure. In one form, the method may include: providing a base, where the base includes a substrate and a fin protruding out of the substrate, a fin mask layer is formed on the top of the fin, and the base includes a graphics-intensive region and a graphics-sparse region; forming an isolation material layer on the substrate exposed by the fin, where the isolation material layer exposes the top of the fin mask layer; performing first etching processing on the isolation material layer, where the residual isolation material layer covers a partial sidewall of the fin mask layer, and the top of the residual isolation material layer located on the graphics-sparse region is lower than the top of the residual isolation material layer located on the graphics-intensive region; removing the fin mask layer after the first etching processing is performed; and performing second etching processing on the residual isolation material layer using an isotropic dry etching process after the fin mask layer is removed, where the etched isolation material layer is used as an isolation layer, and the isolation layer covers a partial sidewall of the fin.

In some implementations of the present disclosure, after the first etching processing is performed, the residual isolation material layer covers the partial sidewall of the fin mask layer. Therefore, after the fin mask layer is removed, a plurality of openings is formed in the isolation material layer, the quantity of openings located on the graphics-intensive region is greater than the quantity of openings located on the graphics-sparse region, and the area of the isolation material layer exposed by an opening sidewall of the graphics-intensive region is larger. In the step of performing second etching processing, etching gas can react with the isolation material layer exposed by the opening sidewall. On the same area region, compared with the graphics-sparse region, the surface area of the isolation material layer in contact with the etching gas is larger on the graphics-intensive region. Therefore, the etching rate of the second etching processing for the isolation material layer located on the graphics-intensive region is larger, and when the etching time is certain, the etching amount of the isolation material layer located on the graphics-intensive region is larger. In some implementations of the present disclosure, the first etching processing is performed on the isolation material layer before the second etching processing, so that the top of the residual isolation material layer located on the graphics-sparse region is lower than the top of the residual isolation material layer located on the graphics-intensive region. Therefore, through the first etching processing, the variability of the etching amounts of the isolation material layers in different graphics density regions in the step of the second etching processing can be compensated, thereby improving the height consistency of the tops of the isolation layers located on the graphics-intensive region and the graphics-sparse region, reducing the probability that the semiconductor structure has a variability problem, and optimizing the performance of the semiconductor structure.

To make the foregoing objectives, features, and advantages of embodiments and implementations of the present disclosure clearer and more comprehensible, the following describes specific embodiments and implementations of the present disclosure in detail with reference to the accompanying drawings.

FIG. 6 to FIG. 11 are schematic structural diagrams corresponding to steps in one form of a method for forming a semiconductor structure according to the present disclosure.

Figure 6:
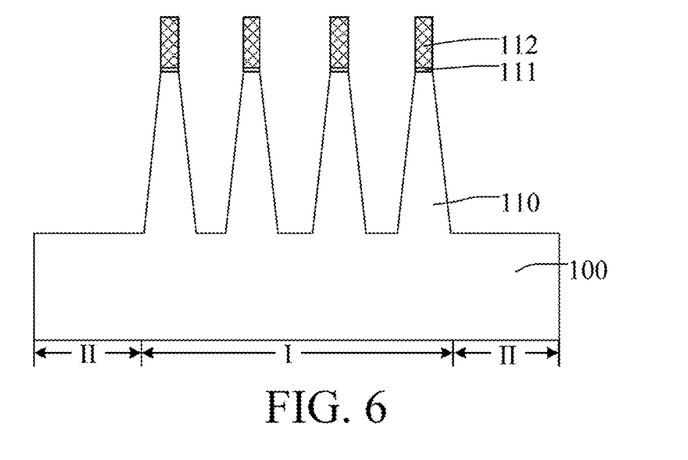
FIG. 6 to FIG. 11 are schematic structural diagrams corresponding to steps in one form of an embodiment of a method for forming a semiconductor structure according to the present disclosure.

Referring to FIG. 6, a base is provided, where the base includes a substrate 100 and a fin 110 protruding out of the substrate 100, a fin mask layer 112 is formed on the top of the fin 110, and the base includes a graphics-intensive region I and a graphics-sparse region II.

The substrate 100 is used to provide a process platform for forming a semiconductor structure subsequently.

In some implementations, the substrate 100 is a Si substrate. In other implementations, the material of the substrate may also be another material such as Ge, SiGe, SiC, GaAs, or InGa. The substrate may also be a substrate of another type, such as a Si substrate on an insulator or a Ge substrate on an insulator.

The fin 110 is used to provide a channel of a FinFET subsequently.

In some implementations, the fin 110 and the substrate 100 are obtained by etching the same semiconductor layer. In other implementations, the fin may also be epitaxially growing on a semiconductor layer on the substrate, thereby achieving the objective of precisely controlling the height of the fin.

Therefore, in some implementations, the material of the fin 110 is the same as the material of the substrate 100, and the material of the fin 110 is Si. In other implementations, the material of the fin may also be Ge, SiGe, SiC, GaAs, or InGa.

In some implementations, the graphics-intensive region I is a device region (not marked) used to form devices, and the graphics-sparse region II is an isolation region (not marked) located between neighboring device regions, that is, the fin 110 is not formed on the isolation region. In other implementations, the fin may be formed on both the graphics-intensive region and the graphics-sparse region, the graphics-intensive region is correspondingly a region on which more fins are formed, and the graphics-sparse region is correspondingly a region on which fewer fins are formed.

The fin mask layer 112 is used as an etching mask for forming the fin 110 and the substrate 100, and the fin mask layer 112 may further protect the top of the fin 110 in the subsequent process procedure. Therefore, the position and the quantity of the fin mask layers 112 correspond to those of the fins 110. In some implementations, the material of the fin mask layer 112 is SiN.

It should be noted that, in some implementations, a pad oxide layer 111 is further formed between the fin mask layer 112 and the fin 110.

The pad oxide layer 111 is used to have a stress cushioning effect during forming of the fin mask layer 112, and during forming of the fin 110 and the substrate 100 using the fin mask layer 112 as a mask, thereby improving the adhesion between the fin mask layer 112 and the fin 110, and avoiding a dislocation problem generated when the fin mask layer 112 is in direct contact with the fin 110.

In some implementations, the material of the pad oxide layer 111 is SiO.

Figure 7:
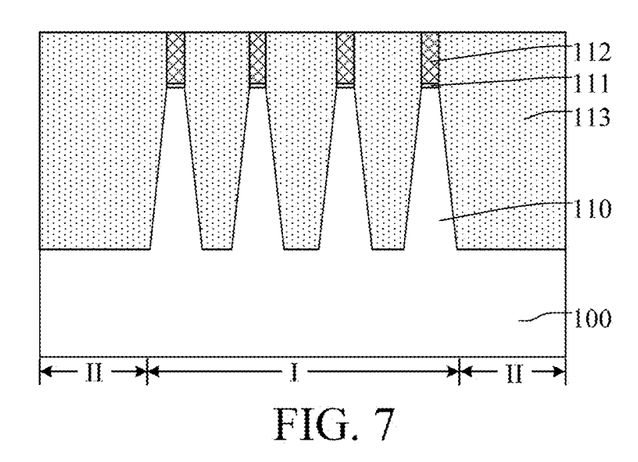

Referring to FIG. 7, an isolation material layer 113 is formed on the substrate 100 exposed by the fin 110, where the isolation material layer 113 exposes the top of the fin mask layer 112.

The isolation material layer 113 is used to form an isolation layer subsequently, to further implement the electrical insulation between neighboring devices.

In some implementations, the material of the isolation material layer 113 is SiO. SiO is a dielectric material that is commonly in the process and that has relatively low costs and relatively high process compatibility, to help reduce the process difficulty and the process costs for forming the isolation material layer 113. In addition, the dielectric constant of SiO is relatively small, and it further helps improve the effect of the subsequent isolation layer for isolating the neighboring devices. In other implementations, the material of the isolation layer may also be another insulating material such as SiN or SiON.

In some implementations, the isolation material layer 113 is formed using a flowable chemical vapor deposition (FCVD) process. The FCVD process has an excellent filling capability, and is suitable for filling an opening with a high aspect ratio, to help reduce the probability that a defect such as a cavity is formed in the isolation material layer 113, and correspondingly help improve the film quality of the subsequent isolation layer.

Specifically, the step of forming the isolation material layer 113 includes: forming an initial isolation material layer (not shown in the figure) on the substrate 100 exposed by the fin 110, where the initial isolation material layer covers the top of the fin mask layer 112; and grinding and removing the initial isolation material layer on the top of the fin mask layer 112 using a chemical mechanic planarization (CMP) process, where the residual initial isolation material layer is used as the isolation material layer 113.

Using the CMP process can help improve the flatness of the top of the isolation material layer 113, and correspondingly improve the height consistency of the tops of the isolation material layers 113.

In some implementations, to reduce the process difficulty in forming the isolation material layer 113, the top of the isolation material layer 113 is aligned with the top of the fin mask layer 112. In other implementations, the top of the isolation material layer may also be lower than the top of the fin mask layer.

Figure 8:
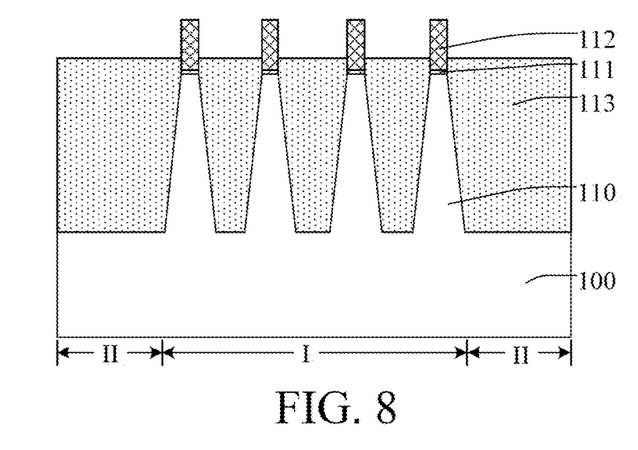

Referring to FIG. 8, the forming method further includes: performing pre-etching processing on the isolation material layer 113 using an isotropic dry etching process, where the pre-etched isolation material layer 113 covers a partial sidewall of the fin mask layer 112.

Through the pre-etching processing, the height of the top of the isolation material layer 113 is reduced, and a relatively long time needed for performing the first etching processing subsequently is avoided, thereby improving the process manufacturing efficiency, avoiding an excessively long time for etching the first etching processing, and correspondingly further helping avoid the excessively large variability of the etching amounts of the first etching processing for the isolation material layers 113 located on the graphics-intensive region I and the graphics-sparse region II, so that after the first etching processing is performed, the distance between the top of the residual isolation material layer 113 located on the graphics-intensive region I and the top of the residual isolation material layer 113 located on the graphics-sparse region II can meet the process requirement, thereby further improving the effect of the first etching processing for improving the height consistency of the tops of the isolation layers located on different graphics density regions.

In some implementations, etching gas used in the pre-etching processing is HF gas. The HF gas is gas commonly used to etch a SiO material in the semiconductor field, and the process compatibility of the pre-etching processing can be improved using the HF gas.

Specifically, the HF gas and NH3 gas are injected into a reaction chamber to perform the pre-etching processing. The NH3 gas is used as the catalyst of the reaction, and can improve the etching rate of the pre-etching processing, thereby further improving the production-manufacture efficiency.

In some implementations, the gas is injected into the reaction chamber to etch the isolation material layer 113, and the pre-etching processing is performed without generating plasma etching. Therefore, the pre-etching processing is an isotropic dry etching process. In other implementations, according to actual process requirements, the pre-etching processing may also be performed using a wet etching process, an anisotropic dry etching process, or a combination of the two etching processes.

Specifically, the isotropic dry etching process used in the pre-etching processing is a Certas etching process.

Using the Certas process can help reduce the probability of a dishing problem on the top of the isolation material layer 113, and can further improve the etching uniformity of the pre-etching processing.

It should be noted that, in some implementations, the pad oxide layer 111 is formed between the fin mask layer 112 and the fin 110, and the material of the pad oxide layer 111 is the same as the material of the isolation material layer 113. Therefore, the pre-etched isolation material layer 113 is made to cover the partial sidewall of the fin mask layer 112, to avoid an undercut problem caused by performing lateral etching on the pad oxide layer 111 in the process of the pre-etching processing, thereby avoiding the problem that the fin mask layer 112 located on the pad oxide layer 111 slants or falls, and further avoiding the bad impact of particles formed by the falling of the fin mask layer 112 for the vacuum environment of the pre-etching processing.

Therefore, after the pre-etching processing is performed, the distance between the top of the isolation material layer 113 and the top of the pad oxide layer 111 should not be excessively small or excessively large. If the distance between the top of the isolation material layer 113 and the top of the pad oxide layer 111 is excessively small, the probability of performing lateral etching on the pad oxide layer 111 in the preprocessing is relatively large, and the probability that the fin mask layer 112 slants or falls is easily increased. If the distance between the top of the isolation material layer 113 and the top of the pad oxide layer 111 is excessively large, a relatively long time is needed to perform the first etching processing subsequently, the excessively large variability of the etching amounts of the isolation material layers 113 located on the graphics-intensive region I and the graphics-sparse region II is easily caused, and the effect of the first etching processing for improving the height consistency of the tops of the isolation layers located on the graphics-intensive region I and the graphics-sparse region II is reduced. Therefore, in some implementations, the distance between the top of the isolation material layer 113 and the top of the pad oxide layer 111 is 7 nm to 10 nm.

Figure 9:
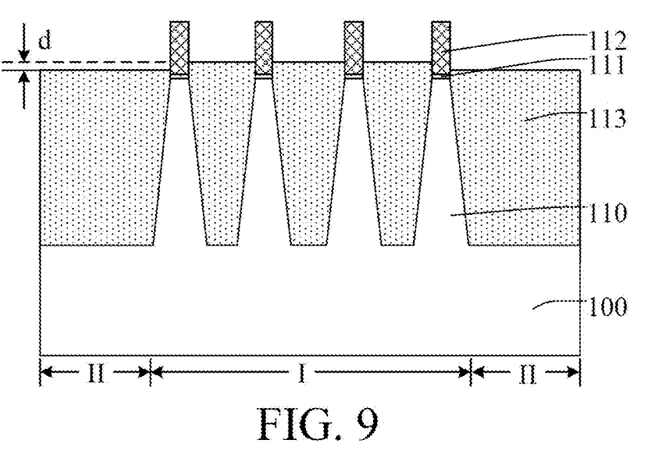

Referring to FIG. 9, first etching processing is performed on the isolation material layer 113, where the residual isolation material layer 113 covers the partial sidewall of the fin mask layer 112, and the top of the residual isolation material layer 113 located on the graphics-sparse region II is lower than the top of the residual isolation material layer 113 located on the graphics-intensive region I.

The subsequent procedure generally further includes: removing the fin mask layer 112; and performing second etching processing on the residual isolation material layer 113 using an isotropic dry etching process after the fin mask layer 112 is removed, where the etched isolation material layer 113 is used as an isolation layer. The residual isolation material layer 113 obtained after the first etching processing is performed covers the partial sidewall of the fin mask layer 112. Therefore, after the fin mask layer 112 is subsequently removed, a plurality of openings is formed in the isolation material layer 112, the quantity of openings located on the graphics-intensive region I is greater than the quantity of openings located on the graphics-sparse region II, and the area of the isolation material layer 113 exposed by an opening sidewall of the graphics-intensive region I is larger. In the step of performing second etching processing, etching gas can react with the isolation material layer 113 exposed by the opening sidewall. Therefore, on the same area region, compared with the graphics-sparse region II, the surface area of the isolation material layer 113 in contact with the etching gas is larger on the graphics-intensive region I. The etching rate of the second etching processing for the isolation material layer 113 located on the graphics-intensive region I is larger, and when the etching time is certain, the etching amount of the second etching processing for the isolation material layer 113 located on the graphics-intensive region I is larger. In some implementations of the present disclosure, before the second etching processing, first etching processing is performed on the isolation material layer 113, so that the top of the residual isolation material layer 113 located on the graphics-sparse region II is lower than the top of the residual isolation material layer 113 located on the graphics-intensive region I, thereby compensating the variability of the etching amounts of the isolation material layers 113 in different graphics density regions in the step of the second etching processing, improving the height consistency of the tops of the isolation layers located on the graphics-intensive region I and the graphics-sparse region II, reducing the probability of the variability problem of the semiconductor structure, and optimizing the performance of the semiconductor structure.

Especially, in some implementations, the graphics-intensive region I is a device region used to form devices, and the graphics-sparse region II is an isolation region located between neighboring device regions, that is, no fin 110 is formed on the isolation region. In some implementations, no opening is formed on the graphics-sparse region II correspondingly, the variability of the quantities of openings on the graphics-intensive region I and the graphics-sparse region II is relatively large, and the variability of the etching amounts of the subsequent second etching processing for the residual isolation material layer 113 located on the graphics-intensive region I and the graphics-sparse region II is also relatively large correspondingly. Therefore, in some implementations, through the first etching processing, the effect of compensating the variability of the etching amounts of the subsequent second etching processing for the residual isolation material layers 113 on different graphics density regions is relatively obvious, and the height consistency of the tops of the isolation layers located on the graphics-intensive region I and the graphics-sparse region II subsequently can be improved significantly.

Therefore, after the first etching processing is performed on the isolation material layer 113, the distance d between the top of the residual isolation material layer 113 located on the graphics-sparse region II and the top of the residual isolation material layer 113 located on the graphics-intensive region I should not be excessively small or excessively large. If the distance d is excessively small, it is difficult to compensate the variability of the etching amounts of the subsequent second etching processing for the isolation material layers 113 on different graphics density regions. If the distance d is excessively large, after the variability of the etching amounts of the isolation material layers 113 on different graphics density regions, in the process of the subsequent second etching processing is compensated, finally, the top of the isolation layer located on the graphics-sparse region II is lower than the top of the isolation layer located on the graphics-intensive region I, and the effect of the first etching processing for improving the height consistency of the tops of the isolation layers located on different graphics density regions is reduced. Therefore, in some implementations, after the first etching processing is performed on the isolation material layer 113, the distance d between the top of the residual isolation material layer 113 located on the graphics-sparse region II and the top of the residual isolation material layer 113 located on the graphics-intensive region I is 1 nm to 5 nm, for example, 3 nm or 4 nm.

It should be noted that, in some implementations, after the first etching processing is performed, the residual isolation material layer 113 still covers the partial sidewall of the fin mask layer 112, that is, the top of the residual isolation material layer 113 is higher than the top of the pad oxide layer 111. Therefore, after the fin mask layer 112 is removed subsequently, a plurality of openings is formed in the isolation material layer 112. In the step of performing second etching processing on the residual isolation material layer 113 subsequently, the etching amounts of the second etching processing for the isolation material layers 113 located on different graphics density regions are different. Therefore, the first etching processing can have the effect of compensating the variability of the etching amounts.

Specifically, in some implementations, the first etching processing is performed using a wet etching process, to help ensure that after the second etching processing is performed, the top of the residual isolation material layer 113 located on the graphics-sparse region II is lower than the top of the residual isolation material layer 113 located on the graphics-intensive region I, and further the process operation difficulty of the first etching processing and the process costs can be reduced.

Because the surface tension of the isolation material layer 113 located on the graphics-intensive region I is larger, and the speed of an etching solution of a wet etching process entering the isolation material layer 113 located on the graphics-intensive region I is slower, the etching rate of the wet etching process for the isolation material layer 113 located on graphics-intensive region I is smaller. Therefore, when the etching time is certain, the loss amount of the isolation material layer 113 located on the graphics-intensive region I is larger, so that the first etching processing can have the effect of compensating the variability of the etching amounts of the subsequent second etching processing for the isolation material layers 113 on different graphics density regions.

In some implementations, the wet etching process is performed using an etching solution containing fluorine. The etching solution containing fluorine can react with SiO to generate fluosilicic acid. The fluosilicic acid can dissolve in water, and is easily removed. Therefore, the fluosilicic acid can help reduce the operation difficulty of the first etching processing, and has fewer by-products.

Specifically, the wet etching process is performed using a DHF solution. The DHF solution is a common etching solution of SiO in the semiconductor process, and can help reduce the process costs and improve the process compatibility.

It should be noted that, the volume percentage of HF in the DHF solution should not be excessively low or excessively high. If the volume percentage of HF is excessively low, an excessively slow etching rate is easily caused, and the production capacity is further reduced. If the volume percentage of HF is excessively high, the process stability of the first etching processing is easily reduced, and the etching amount of the isolation material layer 113 easily exceeds a preset range. The top of the residual isolation material layer 113 after the first etching processing may be lower than the top of the pad oxide layer 113. Therefore, in some implementations, the volume percentage of HF in the DHF solution is 50:1 to 2000:1.

Specifically, the volume percentage of HF in the DHF solution may be 300:1, so that when the etching rate is ensured, after the first etching processing, the distance between the top of the residual isolation material layer 113 located on the graphics-intensive region I and the top of the residual isolation material layer 113 located on the graphics-sparse region II meets the process requirement, and the effect of the first etching processing for compensating the variability of the etching amounts of the isolation material layers 113 of the subsequent second etching processing is more obvious.

In some implementations, the wet etching process is performed at room temperature, and the etching solution does not need to be heated, thereby simplifying the process procedure, and avoiding the bad impact caused to the semiconductor structure by excessively high or excessively low temperature.

The room temperature refers to indoor temperature in the production workshop.

It should be further noted that, the etching time of the wet etching process should not be excessively short or excessively long. If the etching time is excessively short, it is difficult for the etching amount of the isolation material layer 113 to meet the process requirement, and after the first etching processing, it is difficult for the height difference of the tops of the residual isolation material layers 113 on different graphics density regions to compensate the variability of the etching amounts in the step of the subsequent second etching processing. If the etching time is excessively long, the height difference of the tops of the residual isolation material layers 113 on different graphics density regions may be excessively large, the top of the residual isolation material layer 113 may be lower than the top of the pad oxide layer 111, and the excessively long etching time may reduce the production capacity, and increase the process risks. Therefore, in some implementations, the etching time of the wet etching process is 10 s to 120 s.

In some implementations, for example, the first etching processing is performed using the wet etching process. After the first etching processing, the top of the residual isolation material layer 113 located on the graphics-sparse region II is lower than the top of the residual isolation material layer 113 located on the graphics-intensive region I. In other implementations, the objective may also be achieved using a corresponding dry etching process or a wet and dry combination process, or the objective may be achieved in the manner of forming a mask layer on the graphics-intensive region, and only performing first etching processing on the isolation material layer located on the graphics-sparse region using the mask layer as a mask.

Figure 10:
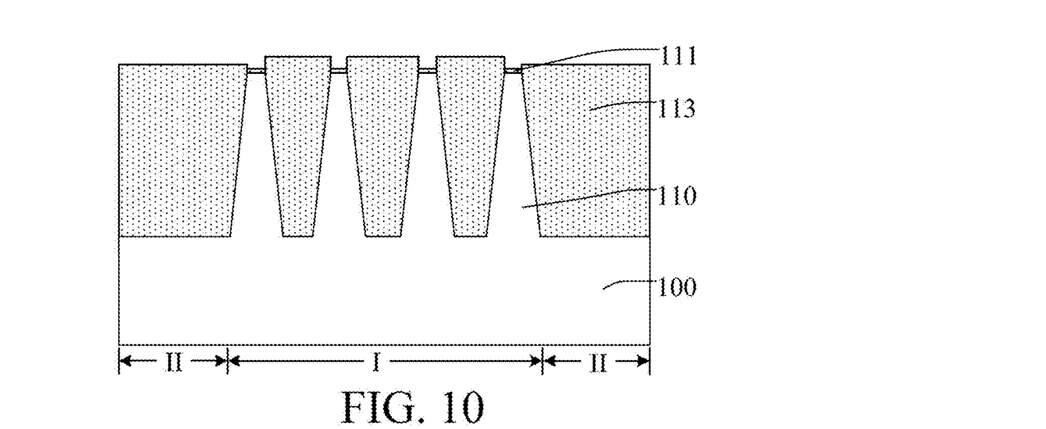

Referring to FIG. 10, after the first etching processing is performed, the fin mask layer 112 (as shown in FIG. 9) is removed.

The fin mask layer 112 is removed to provide a process platform for subsequently forming a gate structure across the fin 110.

The subsequent procedure further includes: performing second etching processing on the residual isolation material layer 113 using an isotropic dry etching process. In some implementations, before the second etching processing, the fin mask layer 112 is removed to avoid etching of the second etching processing for the pad oxide layer 111, thereby avoiding the problem of falling of the fin mask layer 112, and further avoiding the bad impact of particles formed by the falling of the fin mask layer 112 for the vacuum environment of the second etching processing.

Specifically, the fin mask layer 112 is removed using a wet etching process. The wet etching process is simple in operation, and has low process costs.

In some implementations, the material of the fin mask layer 112 is SiN. Therefore, the wet etching process is performed using a phosphoric acid solution. The phosphoric acid solution is an etching solution that is commonly used to etch a SiN material in the semiconductor process, and the phosphoric acid solution is used to help reduce the process costs, and improve the process compatibility.

It should be noted that, after the first etching processing is performed, the residual isolation material layer 113 covers the partial sidewall of the fin mask layer 112. Therefore, after the fin mask layer 113 is removed, a plurality of opening (not marked) is formed in the isolation material layer 113, and the opening exposes the pad oxide layer 111.

Figure 11:
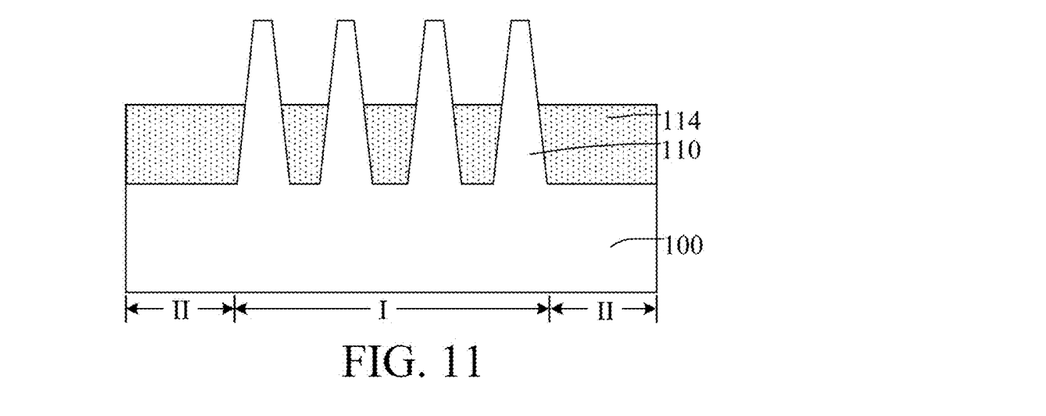

Referring to FIG. 11, after the fin mask layer 112 is removed (as shown in FIG. 9), second etching processing is performed on the residual isolation material layer 113 using an isotropic dry etching process, where the etched isolation material layer 113 is used as an isolation layer 114, and the isolation layer 114 covers a partial sidewall of the fin 110.

The isolation layer 114 is used to have an electrical isolation effect between the neighboring devices.

It should be noted that, because the plurality of openings is formed in the residual isolation material layer 113, and more openings are located on the graphics-intensive region I, in the process of the second etching processing, on the same area region, compared with the graphics-sparse region II, the surface area of the isolation material layer 113 in contact with the etching gas is larger on the graphics-intensive region I, and the etching rate of the second etching processing for the isolation material layer 113 located on the graphics-intensive region I is larger. When the etching time is certain, the etching amount of the isolation material layer 113 located on the graphics-intensive region I is larger. Before the second etching processing is performed, first etching processing is performed on the isolation material layer 113, so that the top of the residual isolation material layer 113 located on the graphics-sparse region II is lower than the top of the residual isolation material layer 113 located on the graphics-intensive region I, thereby compensating the variability of the etching amounts of the isolation material layers 113 in the second etching processing. Therefore, the height consistency of the tops of the isolation layers 114 located on the graphics-intensive region I and the graphics-sparse region II is better, and the performance of the semiconductor structure is improved.

In some implementations, etching gas used in the second etching processing is HF gas. The HF gas can be used to improve the process compatibility of the second etching processing, and reduce the process costs.

Specifically, the HF gas and NH3 gas are injected into a reaction chamber to perform the pre-etching processing. The NH3 gas is used as the catalyst of the reaction, and can improve the etching rate of the pre-etching processing, thereby further improving the production-manufacture efficiency.

In some implementations, the gas is injected into the reaction chamber to etch the residual isolation material layer 113, and the second etching processing is performed without generating plasma. Therefore, the second etching processing is an isotropic dry etching process. In other implementations, according to actual process requirements, the second etching processing may also be performed using a wet etching process, an anisotropic dry etching process, or a combination of the two etching processes.

Specifically, the isotropic dry etching process is performed using a Certas etching process. The Certas process may be used to help further reduce the variability of the etching amounts of the second etching processing for the isolation material layers 113 on different graphics density regions, further help reduce the probability of a dishing problem on the top of the isolation material layer 113, and further improve the etching uniformity of the second etching processing.

It should be noted that, the material of the pad oxide layer 111 is the same as the material of the isolation material layer 113. Therefore, in the step of performing the second etching processing, the pad oxide layer 111 is removed, to expose the top of the fin 110.

It should be further noted that, in some implementations, after the isolation layer 114 is formed, the forming method further includes: performing deionized water cleaning processing.

In the process of the second etching processing, ammoniac compounds may be generated to stick to the surface of the fin 110, and the ammoniac compounds may be in contact with air and water to generate alkaline matters having a corrosive effect to the material of the fin 110. The deionized water cleaning processing may be used to clean the ammoniac compounds, to avoid damaging the fin 110, and further avoid the bad impact on the electrical performance of the semiconductor structure.

Correspondingly, the present disclosure further provides a semiconductor structure. Referring to FIG. 9, FIG. 9 is a schematic structural diagram of an embodiment of a semiconductor structure according to the present disclosure.

The semiconductor structure includes: a substrate 100, where the substrate 100 includes a graphics-intensive region I and a graphics-sparse region II; a fin 110, protruding out of the substrate 100; a fin mask layer 112, located on the top of the fin 110; and a residual isolation material layer 113, located on the substrate 100 exposed by the fin 110, where the residual isolation material layer 113 covers a partial sidewall of the fin mask layer 112, and the top of the residual isolation material layer 113 located on the graphics-sparse region II is lower than the top of the residual isolation material layer 113 located on the graphics-intensive region I.

Subsequently, generally, the fin mask layer 112 needs to be further removed, and etching processing is performed on the residual isolation material layer 113 using an isotropic dry etching process, where the etched isolation material layer 113 is used as an isolation layer. The residual isolation material layer 113 covers the partial sidewall of the fin mask layer 112. Therefore, after the fin mask layer 112 is removed subsequently, a plurality of openings is formed in the isolation material layer 112, and more openings are located on the graphics-intensive region I. In the process of subsequent etching processing, on the same area region, compared with the graphics-sparse region II, the surface area of the isolation material layer 113 in contact with the etching gas is larger on the graphics-intensive region I, and the etching rate of the second etching processing for the isolation material layer 113 located on the graphics-intensive region I is larger. When the etching time is certain, the etching amount of the second etching processing for the isolation material layer 113 located on the graphics-intensive region I is larger. In some implementations, the top of the residual isolation material layer 113 located on the graphics-sparse region II is made to be lower than the top of the residual isolation material layer 113 located on the graphics-intensive region I, thereby having the effect of compensating the variability of the etching amounts of the subsequent second etching processing for the isolation material layers 113 on different graphics density regions, improving the height consistency of the tops of the subsequent isolation layers, and further improving the electrical performance of the semiconductor structure.

The substrate 100 is used to provide a process platform for forming a semiconductor structure.

In some implementations, the substrate 100 is a Si substrate. In other implementations, the material of the substrate may also be another material such as Ge, SiGe, SiC, GaAs, or InGa. The substrate may also be a substrate of another type, such as a Si substrate on an insulator or a Ge substrate on an insulator.

The fin 110 is used to provide a channel of a FinFET.

In some implementations, the fin 110 and the substrate 100 are obtained by etching the same semiconductor layer. In other implementations, the fin may also be epitaxially growing on a semiconductor layer on the substrate, thereby achieving the objective of precisely controlling the height of the fin.

Therefore, in some implementations, the material of the fin 110 is the same as the material of the substrate 100, and the material of the fin 110 is Si. In other implementations, the material of the fin may also be Ge, SiGe, SiC, GaAs, or InGa.

In some implementations, the graphics-intensive region I is a device region (not marked) used to form devices, and the graphics-sparse region II is an isolation region (not marked) located between neighboring device regions, that is, the fin 110 is not formed on the isolation region. In other implementations, the fin may be formed on both the graphics-intensive region and the graphics-sparse region, the graphics-intensive region is correspondingly a region on which more fins are formed, and the graphics-sparse region is correspondingly a region on which fewer fins are formed.

Therefore, in some implementations, after the fin mask layer 112 is removed subsequently, no opening is formed in the graphics-sparse region II correspondingly, the variability of the quantities of the openings on the graphics-intensive region I and the graphics-sparse region II is relatively large, and the variability of the etching amounts of the subsequent etching processing for the residual isolation material layers 113 located on the graphics-intensive region I and the graphics-sparse region II is also relatively large correspondingly. Therefore, in some implementations, the top of the residual isolation material layer 113 located on the graphics-sparse region II is made to be lower than the top of the residual isolation material layer 113 located on the graphics-intensive region I, so that the effect of compensating the variability of the etching amounts of the subsequent etching processing for the residual isolation material layers 113 on different graphics density regions is relatively obvious, and the height consistency of the tops of the isolation layers located on the graphics-intensive region I and the graphics-sparse region II subsequently can be significantly improved.

The fin mask layer 112 is used as an etching mask for forming the fin 110 and the substrate 100, and the fin mask layer 112 may further protect the top of the fin 110 in the forming process of the semiconductor structure. Therefore, the position and the quantity of the fin mask layers 112 correspond to those of the fins 110. In some implementations, the material of the fin mask layer 112 is SiN.

It should be noted that, in some implementations, the semiconductor structure further includes: a pad oxide layer 111, located between the fin mask layer 112 and the fin 110.

The pad oxide layer 111 is used to have a stress cushioning effect during forming of the fin mask layer 112, and during forming of the fin 110 and the substrate 100 using the fin mask layer 112 as a mask, thereby improving the adhesion between the fin mask layer 112 and the fin 110, and avoiding a dislocation problem generated when the fin mask layer 112 is in direct contact with the fin 110.

In some implementations, the material of the pad oxide layer 111 is the same as the material of the isolation material layer 113, and the material of the pad oxide layer 111 is SiO.

The residual isolation material layer 113 is used to form an isolation layer subsequently, to further implement the electrical insulation between neighboring devices.

In some implementations, the material of the isolation material layer 113 is SiO. SiO is a dielectric material that is commonly in the process and that has relatively low costs and relatively high process compatibility, to help reduce the process difficulty and the process costs for forming the isolation material layer 113. In addition, the dielectric constant of SiO is relatively small, and it further helps improve the effect of the subsequent isolation layer for isolating the neighboring devices. In other implementations, the material of the isolation layer may also be another insulating material such as SiN or SiON.

In some implementations, the top of the residual isolation material layer 113 located on the graphics-sparse region II is made to be lower than the top of the residual isolation material layer 113 located on the graphics-intensive region I, to further have the effect of compensating the variability of the etching amounts of the subsequent etching processing.

It should be noted that, in some implementations, the distance d between the top of the residual isolation material layer 113 located on the graphics-sparse region II and the top of the residual isolation material layer 113 located on the graphics-intensive region I should not be excessively small or excessively large. If the distance d is excessively small, it is difficult to compensate the variability of the etching amounts of the subsequent etching processing for the isolation material layers 113 on different graphics density regions. If the distance d is excessively large, after the variability of the etching amounts of the isolation material layers 113 on different graphics density regions in the process of the subsequent etching processing is compensated, finally, the top of the isolation layer located on the graphics-sparse region II is lower than the top of the isolation layer located on the graphics-intensive region I, and the height consistency of the tops of the isolation layers is poor. Therefore, in some implementations, the distance d between the top of the residual isolation material layer 113 located on the graphics-sparse region II and the top of the residual isolation material layer 113 located on the graphics-intensive region I is 1 nm to 5 nm, for example, 3 nm or 4 nm.

The semiconductor structure may be formed using the forming method in the foregoing embodiments, or may be formed using another forming method. For specific descriptions for the semiconductor structure of some implementations, reference may be made to corresponding descriptions in the foregoing embodiment. Details are not described herein again in some implementations.

Although the present disclosure is disclosed as above, the present disclosure is not limited thereto. Various variations and modifications may be made by any person skilled in the art without departing from the spirit and scope of the present disclosure. Therefore, the protection scope of the present disclosure shall be subject to the scope limited by the claims.

What is claimed is:

1. A method for forming a semiconductor structure, comprising:
   providing a base, wherein the base comprises a substrate and a fin protruding out of the substrate, a fin mask layer is formed on the top of the fin, and the base comprises a graphics-intensive region and a graphics-sparse region;
   forming an isolation material layer on the substrate exposed by the fin, wherein the isolation material layer exposes a top of the fin mask layer;
   performing first etching processing on the isolation material layer, wherein a residual isolation material layer covers a partial sidewall of the fin mask layer, and a top of the residual isolation material layer located on the graphics-sparse region is lower than a top of the residual isolation material layer located on the graphics-intensive region;
   removing the fin mask layer after the first etching processing is performed; and
   performing second etching processing on the residual isolation material layer using an isotropic dry etching process after the fin mask layer is removed, wherein the etched isolation material layer is used as an isolation layer, and the isolation layer covers a partial sidewall of the fin.

2. The method for forming a semiconductor structure according to claim 1, wherein the first etching processing is performed using a wet etching process.

3. The method for forming a semiconductor structure according to claim 1, wherein the method further comprises: before performing the first etching processing, performing pre-etching processing on the isolation material layer using an isotropic dry etching process, wherein the pre-etched isolation material layer covers the partial sidewall of the fin mask layer.

4. The method for forming a semiconductor structure according to claim 2, wherein the wet etching process is performed using an etching solution containing fluorine.

5. The method for forming a semiconductor structure according to claim 2, wherein the wet etching process is performed using a dilute hydrofluoric acid (DHF) solution.

6. The method for forming a semiconductor structure according to claim 2, wherein the wet etching process is performed using a DHF solution, and a volume percentage of hydrofluoric acid (HF) in the DHF solution is 50:1 to 2000:1.

7. The method for forming a semiconductor structure according to claim 2, wherein the wet etching process is performed using a DHF solution, a temperature of the DHF solution is room temperature, and an etching time is 10 s to 120 s.

8. The method for forming a semiconductor structure according to claim 1, wherein after the first etching processing is performed on the isolation material layer, a distance between the top of the residual isolation material layer located on the graphics-sparse region and the top of the residual isolation material layer located on the graphics-intensive region is 1 nm to 5 nm.

9. The method for forming a semiconductor structure according to claim 1, wherein etching gas used in the second etching processing is HF gas.

10. The method for forming a semiconductor structure according to claim 1, wherein the isotropic dry etching process used in the second etching processing is a Certas etching process.

11. The method for forming a semiconductor structure according to claim 3, wherein etching gas used in the pre-etching processing is HF gas.

12. The method for forming a semiconductor structure according to claim 3, wherein the isotropic dry etching process used in the pre-etching processing is a Certas etching process.

13. The method for forming a semiconductor structure according to claim 3, wherein:
   in the step of providing a base, a pad oxide layer is further formed between the fin mask layer and the fin;
   a material of the pad oxide layer is the same as a material of the isolation material layer; and
   after the pre-etching processing is performed, a distance between the top of the isolation material layer and a top of the pad oxide layer is 7 nm to 10 nm.

14. The method for forming a semiconductor structure according to claim 1, wherein after the isolation layer is formed, the forming method further comprises:
   performing deionized water cleaning processing.

15. The method for forming a semiconductor structure according to claim 1, wherein the graphics-intensive region is a device region used to form devices, and the graphics-sparse region is an isolation region located between neighboring device regions.

* * * * *